United States Patent
Poplavskyy et al.

(10) Patent No.: US 7,452,613 B2
(45) Date of Patent: Nov. 18, 2008

(54) WHITE ORGANIC ELECTROLUMINESCENT DEVICE

(75) Inventors: Dmytro Poplavskyy, San Jose, CA (US); Vi-En Choong, San Jose, CA (US)

(73) Assignee: Osram Opto-Semiconductors, GmbH (DE)

( * ) Notice: Subject to any disclaimer, the term of this patent is extended or adjusted under 35 U.S.C. 154(b) by 522 days.

(21) Appl. No.: 10/932,830

(22) Filed: Sep. 1, 2004

(65) Prior Publication Data
US 2006/0043885 A1    Mar. 2, 2006

(51) Int. Cl.
*H01L 51/50* (2006.01)
*H05B 33/12* (2006.01)

(52) U.S. Cl. .............. 428/690; 428/212; 428/917; 313/504; 313/506

(58) Field of Classification Search .......... 428/690, 428/917, 212; 313/504, 506; 427/66
See application file for complete search history.

(56) References Cited

U.S. PATENT DOCUMENTS

| | | | |
|---|---|---|---|
| 5,807,627 | A | 9/1998 | Friend et al. |
| 6,559,256 | B2 * | 5/2003 | Holmes et al. .............. 526/260 |
| 6,982,179 | B2 * | 1/2006 | Kwong et al. ................. 438/22 |
| 2004/0046495 | A1 * | 3/2004 | Peng ........................... 313/504 |
| 2004/0069995 | A1 * | 4/2004 | Magno et al. ................... 257/80 |
| 2004/0124766 | A1 * | 7/2004 | Nakagawa et al. ........... 313/504 |
| 2005/0156176 | A1 * | 7/2005 | Gupta et al. .................... 257/79 |
| 2005/0158523 | A1 * | 7/2005 | Gupta et al. ............. 428/195.1 |

OTHER PUBLICATIONS

C.D. Muller, et al., "Multi-colour organic light-emitting displays by solution processing," (2003), Nature 421, pp. 829-833.
Clearfield, H.M., Progress in the Commercialization of Lumation* Light-Emitting Polymers (LEPs), Dow Chemical Company, OLEDs Asia, 2004, pp. 1-23.
Kawamura, Yuichiro et al., "Energy transfer in polymer electrophosphorescent light emitting devices with single and multiple doped luminescent layers", Journal of Applied Physics, vol. 92, No. 1, Jul. 1, 2002, pp. 87-93.
Meulenkamp, Eric A. et al., "High efficiency polymer LEDs: triplets and novel devices", no date provided.
Lee, Jeong-Il et al., "White light emitting diodes using polymer blends", Optical Materials 21 (2002) 205-210.
Kido, Junji et al., "Multilayer White Light-Emitting Organic Electroluminescent Device", Science, vol. 267, Mar. 3, 1995, 1332-1334.

* cited by examiner

*Primary Examiner*—Dawn Garrett
(74) *Attorney, Agent, or Firm*—Dickstein, Shapiro, LLP.

(57) ABSTRACT

What is disclosed is an organic electroluminescent device which produces a white output spectrum. A plurality of emissive layers, each emitting in a particular spectrum, are fabricated together in one device by cross-linking at least some the layers. One of the emissive layers has both an emissive and a non-emissive function.

35 Claims, 5 Drawing Sheets

WHITE ORGANIC ELECTROLUMINESCENT DEVICE

BACKGROUND

1. Field of the Invention

This invention relates generally to the art of organic electronic devices. More specifically, the invention relates to Organic Light Emitting Diode devices.

2. Related Art

Display and lighting systems based on LEDs (Light Emitting Diodes) have a variety of applications. Such display and lighting systems are designed by arranging a plurality of photo-electronic components ("components") such as arrays of individual LEDs. LEDs that are based upon semiconductor technology have traditionally used inorganic materials, but recently, the organic LED ("OLED") has come into vogue for certain applications.

An OLED is typically comprised of two or more thin at least partially conducting organic layers (e.g., an electrically conducting hole transporting polymer layer (HTLs) and a light emissive polymer (LEP) layer) which are sandwiched between an anode and a cathode. Under an applied forward potential, the anode injects holes into the conducting polymer layer, while the cathode injects electrons into the emissive polymer layer. The injected holes and electrons each migrate toward the oppositely charged electrode and form an exciton in the emissive polymer layer. The exciton relaxes to a lower energy state by emitting a photon.

The color of light emission from such a device structure is controlled by emission properties of the LEP layer. For example, white emission can be achieved by blending a blue-emitting LEP with polymers (or small molecules) that emit in green and red regions of spectrum (see e.g. J.-I. Lee et al, *Optical Materials* 21, 205-210 (2002) and Y. Kawamura et al, *Journal of Applied Physics* 92, 87-93 (2002)). In this case direct carrier trapping and/or energy transfer from the blue host to the red and green dopants will redistribute emission between blue, green and red chromophores thus resulting in white emission. A similar approach is to synthesize a copolymer incorporating all three types of chromophores in one polymer chain thus preventing possible phase separation that may occur in a blend.

However the above approaches have several drawbacks. Doping with emitting chromophores not only changes the emission spectrum but can also result in undesirable changes in charge transport (e.g. due to trapping of charges) properties of the host LEP. In addition to that, as only very small concentrations of emitting dopants are required to change the color of emission, it could be difficult to precisely control relative concentrations of the dopants in order to achieve desirable and reproducible emission color.

Organic LEDs based on small molecule materials (SMOLEDs) offer several advantages over the PLEDs as far as the fabrication of white emitting OLEDs is concerned. Apart from doping one emitting layer with different chromophores, as in the PLED approaches above, white light emission can be achieved by fabricating multilayer structures, the approach that can be easily implemented by sequential vacuum deposition of required organic layers (J. Kido et al, *Science* 267, 1332 (1995)), emitting in different regions of the visible spectrum.

The possibility to fabricate multi-layer SMOLED structures due to the flexibility of vacuum deposition technique cannot be easily employed in PLEDs, which are solution processed. In order to be able to fabricate a multilayer polymer structure, a subsequent polymer layer must be coated using the solvent that does not dissolve the underneath layer onto which the above layer is coated.

One of the approaches is to prepare the first polymer layer via a precursor route whereby a soluble precursor is first spin-coated and then thermally converted to a luminescent polymer insoluble in any of the commonly used solvents. Afterwards a second electroluminescent polymer layer can be applied by spin-coating on top of the first layer. This way a multilayer polymer structure can be realized and emission from both polymer layers can be achieved (R. H. Friend et al, U.S. Pat. No. 5,807,627 (1998)). And generally, if a solvent used for the subsequent layer does not dissolve the previous layer, then a multilayer structure can be prepared. However, this approach is limited in which materials can be used to create the layers. Emission spectrum of such a device is determined by the bandgaps of the emitting polymers constituting each layer and is not readily tunable, since tuning the emission spectrum would involve syntheses of a new polymer.

It would be advantageous to design and fabricate a device structure that can utilize a wide variety of polymers to produce a white emitting OLED device or display.

DETAILED DESCRIPTION OF THE INVENTION

In accordance with the invention, a multiple emissive layer organic electroluminescent device is disclosed. The device contains a plurality of emissive layers, each emissive layer emitting light in a particular spectrum. The device is created by fabricating a first emissive layer capable of emitting in a first spectrum and then rendering the deposited first emissive layer insoluble to a second emissive layer to follow. Afterwards, the second emissive layer is fabricated over the insoluble first emissive layer. This process can be repeated such that each previously fabricated emissive layer is rendered insoluble to the solvent used to fabricate the next emissive layer. This will prevent previously fabricated emissive layer from being degraded by other solvents that are deposited over it during the fabrication of the next emissive layer.

In at least one embodiment of the invention, a white-emitting OLED device/display is created by having two organic emissive layers. The first organic emissive layer is a cross-linkable luminescent polymer emitting in a first spectrum. The second emissive layer is capable of emitting light in a spectrum of multiple colors such that when light emitted from the first emissive layer is combined with light emitted from the second emissive layer, the total output spectrum of the device would be white.

For example, if the first emissive layer is emitting light of a green spectrum, then the second emissive layer would be fabricated to emit light in both blue and red spectrums. Alternatively, if the first emissive layer is emitting light of a red spectrum, then the second emissive layer would be fabricated to emit light in both blue and green spectrums. In yet other embodiments, if the first emissive layer is emitting light of a blue spectrum, then the second emissive layer would be fabricated to emit light in both red and green spectrums.

In some embodiments of the invention, the first emissive layer is to be cross-linkable to such a degree that it can be rendered insoluble in the solvent from which the second emissive layer is coated. A cross-linked (or "cross-linkable") polymer is a polymer which has been modified by the addition of a chemical group which chemically reacts with the original polymer to create side-chains which can alter the polymer's properties. In an earlier publication the use of cross-linked polymers to fabricate multi-color OLEDs have been reported (C. D. Muller et al, *Nature* 421, 829 (2003)).

In some embodiments of the invention, the organic solution used in fabricating the first emissive layer can include UV (ultra-violet) curable inks. UV curable inks are capable of being cross-linked by exposure to ultraviolet radiation. In other embodiments of the invention, the layers may be thermally curable and thus, can be cross-linked by exposure to heat. In still other embodiments of the invention, the layers may be chemically curable and thus, can be cross-linked via a chemical reaction.

In accordance with the invention, the first emissive layer may also be capable of a non-emissive function such as hole transport, electron transport, hole injection, electron injection, charge trapping, charge blocking, wave-guiding and so on. Single-color emission from the crosslinkable layer can be achieved by crosslinking an emissive conjugated polymer, cross linking a blend of a non-emissive conjugated polymer with an emissive conjugated polymer, or by cross linking a non-emissive conjugated polymer which is doped with an emissive monomer or oligomer. Similarly, two-color emission from the second layer can be achieved by using an emissive polymer blended with another emissive polymer, doped with an emissive small molecule, or a copolymer with several emissive chromophores incorporated on the polymer chain or as pendant groups.

Utilizing the various embodiments of the invention, the emission spectra can be easily tuned by using different emissive polymers (or small molecules) blended in small concentrations into each emissive layer. It is advantageous to tune emission spectrum by adding the dopant with the right color to the polymer rather than changing the polymer (as done in conventional devices) in order to tune its emission color. The blending technique allows the emissive layers to emit in two color regions, e.g. blue and red, blue and green, or green and red, or in any combination of colors, as desired.

In other embodiments of the invention, three emissive layers are disclosed. The first emissive layer is a cross-linkable luminescent polymer emitting in a first spectrum. The second emissive layer is disposed over the first emissive layer and is also cross-linkable and capable of emitting light in a second spectrum. The third emissive layer is disposed over the second emissive layer and is capable of emitting light in a third spectrum such that when light emitted from the first emissive layer is combined with light emitted from the second emissive layer and third emissive layer, the total output spectrum of the device would be white. In such an embodiment, the first emissive layer would be cross-linked, and then the second emissive layer would be fabricated, then cross-linked, and finally, the third emissive layer would be fabricated.

Each emissive layer described above may include individual emissive and non-emissive "components" including one or more of a polymer, monomer, oligomer, co-polymer, an organic side-group, and small molecule. In describing the invention, the terms "solution," "layer" and "film" refer to the same material which may be in different physical states before, during and after fabrication. When an organic "solution" is deposited on a surface, it often dries over time into a "film" often aided by heat or other factors. The film then becomes a layer in a device capable of carrying out specific functions. Also, the words "polymer solution" and "organic solution" are used interchangeably to refer to any organic compound, monomer, oligomer, polymer, polymer blend, and the like and is not intended to be restrictive to any one organic compound or class of compounds.

Figure 1:
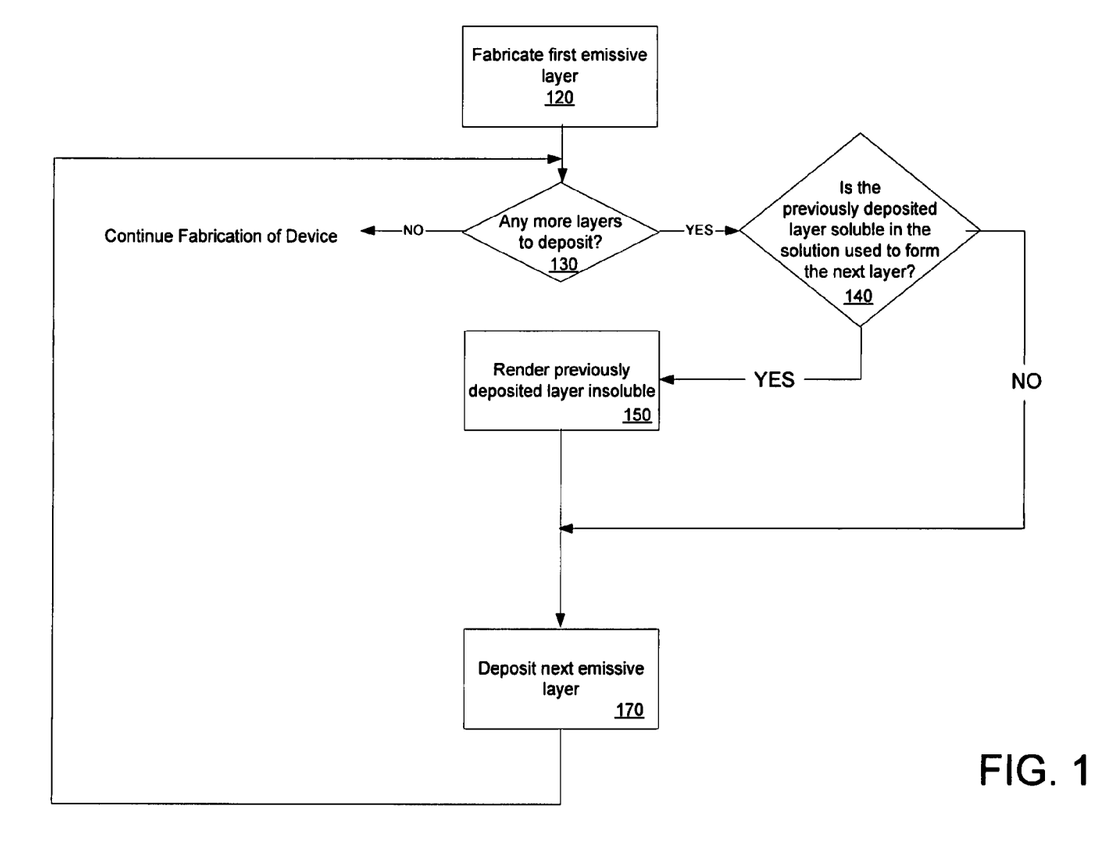
FIG. 1 is a flowchart of at least one embodiment of the invention.

FIG. 1 is a flowchart of at least one embodiment of the invention. A first emissive layer is initially fabricated (block 120). Fabrication may involve many steps, including but not limited to, polymer synthesis, blending, solution processing and so on. Typically, a substrate, electrode or any other deposition surface of the device is already available through prior device processing steps (not shown, see FIG. 2 and associated description). An organic solution(s) containing the polymers, monomers or other components for the first emissive layer is first deposited onto the deposition surface of the device. Solution coating into a film may be done via ink-jet printing, spin-coating, spray coating, screen printing or by using any of suitable techniques for processing solution into film. In some embodiments, the polymer may already be in the form of a film and simply laid down or adhered to the deposition surface.

The solution, after it is deposited, will dry into a film (layer). If there are more layers to deposit (checked at block 130), then rendering the previously deposited layer insoluble would be necessary if the previously deposited layer is soluble in the solvent used in fabricating the next layer (checked at block 140). If this is the case, then the previously deposited layer is rendered insoluble. For instance, cross-linking of the previously deposited layer can be performed. Cross-linking of the deposited solution (film) will render the film insoluble. Cross-linking initiation may involve the addition of an initiator compound either after or prior to deposition. In some embodiments of the invention, cross-linking side-groups included in the polymer chains and/or initiator compounds may already have been blended with the polymer solution prior to deposition (e.g. at block 120). Cross-linking is commenced by applying either ultra-violet radiation or heat or by inducing a particular chemical reaction, depending upon the properties of the deposited solution. In a preferred embodiment of the invention, the deposited solution is heat-curable and hence, can be cross-linked by heating the film to certain elevated temperatures. Chemistry and physics of cross-linkable polymers and monomers with side groups and chains is well-known in the art and is not discussed in great detail.

Once the previously deposited solution is cross-linked or otherwise rendered insoluble (block 150), then the next layer is fabricated (block 170). Without any further curing or cross-linking, after coating the next polymer solution will dry into a film on top of the previously deposited layer. The drying of the film may include a baking step. If there are no more layers to deposit, then any excess solution, if necessary, is removed from the dried film and device processing continues.

If on the other hand, there are still more layers to deposit (initially, more than two) (block 130), then process flow returns to block 140. If the previously deposited layer is soluble in the solution used to form the next (to-be-deposited) layer, then that previously deposited layer is rendered insoluble (block 150) and process flow continues. If not, the next layer is fabricated (block 170). The process shown is repeated until there are no more layers to deposit. Other device processing steps (such as adding cathode metal in the case of an OLED) then commence. A specific application of this technique is described below with respect to FIG. 4. By cross-linking each preceding layer, any number of layers may be deposited upon one another, with little regard to solubility issues. This adds to design flexibility by allowing a wider range of organic emitting materials to be used in conjunction with one another. For instance, a three or four organic layer device can be fabricated efficiently with deposition techniques such as inkjet printing or spin coating even though each layer may be soluble in the same or similar solvents.

Figure 2:
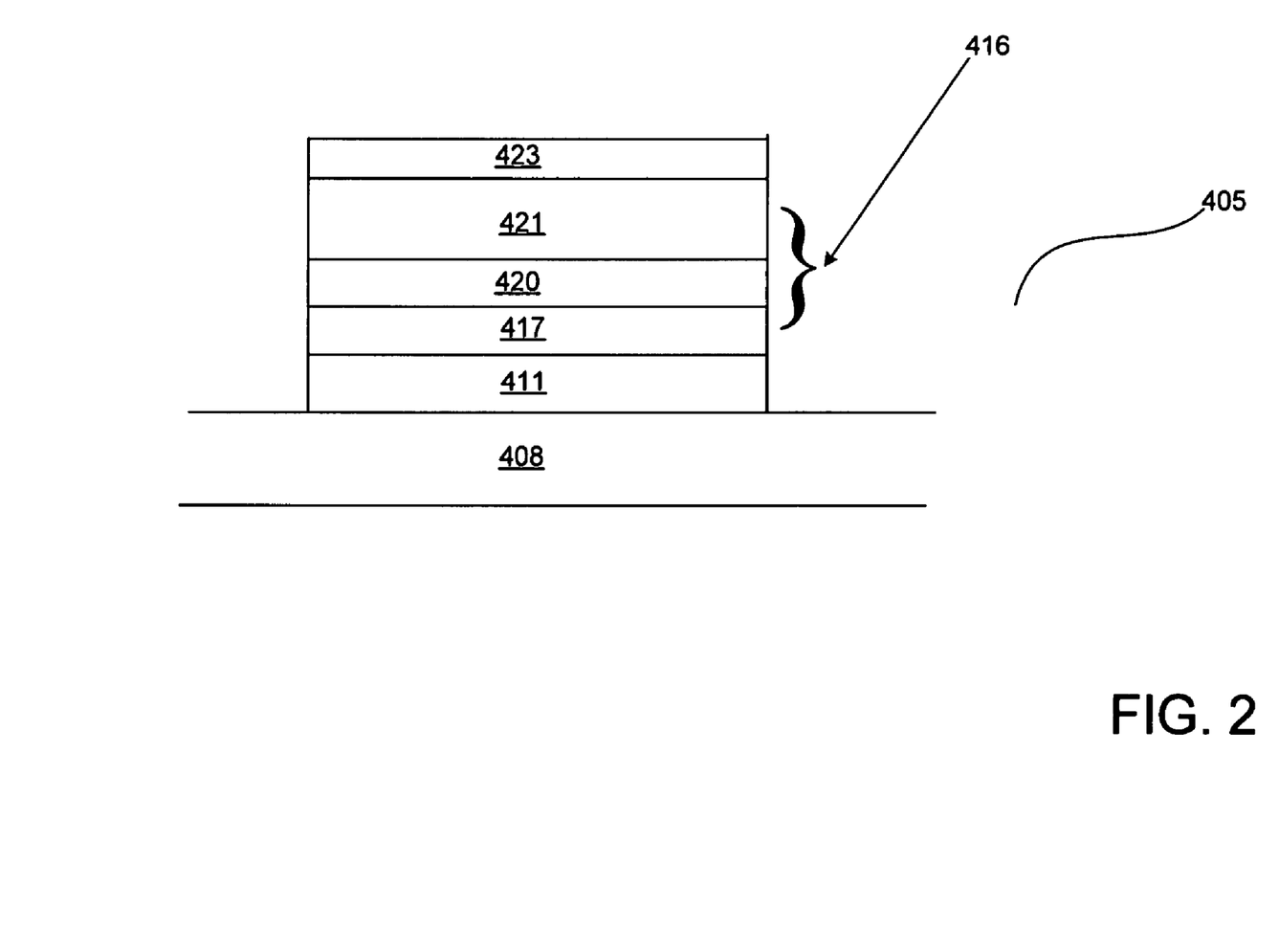
FIG. 2 shows a cross-sectional view of an organic electroluminescent device with two emissive layers according to at least one embodiment of the invention.

FIG. 2 shows a cross-sectional view of an organic electroluminescent device with two emissive layers according to at least one embodiment of the invention. As shown in FIG. 2, the organic electroluminescent device includes a first electrode 411 on a substrate 408. As used within the specification and the claims, the term "on", "over", "above" includes layers that are in physical contact (adjacent) and layers that are separated by one or more intervening layers, or air or other substances. The first electrode 411 may be patterned for pixilated applications or unpatterned for backlight applications. A photo-resist material may be deposited on the first electrode 411 and patterned to form a bank structure (not pictured) having an aperture that exposes the first electrode 411. The aperture may be a pocket (e.g., a pixel of an OLED display) or a line.

One or more organic materials is deposited onto the first electrode 411 (and into the aperture, if available) to form one or more organic layers of an organic stack 416. One or more of the layers (films) comprising organic stack 416 are, in accordance with the invention, cross-linked to become insoluble. The organic stack 416 is disposed above the first electrode 411. The organic stack 416 includes a hole transporting (conducting polymer) layer ("HTL") 417 and at least two emissive layers 420 and 421. If the first electrode 411 is an anode, then the HTL 417 is on the first electrode 411. Alternatively, if the first electrode 411 is a cathode, then the second emissive layer 421 is on the first electrode 411, the first emissive layer 420 is on the second emissive layer 421 and the HTL 417 is on the first emissive layer 420. The electroluminescent device also includes a second electrode 423 (which is either a cathode or anode depending upon the first electrode 411) on the organic stack 416.

Adding additional layers may be desirable in order to improve performance of devices and may include functionalities such as hole transport, electron transport, hole blocking, optical confinement etc. In accordance with the invention, cross-linked films enable a plurality of such organic layers to be formed one of top of another.

In addition a layer made of a single material may be able to provide more than one functionality, for example the same layer may provide hole transport, electron blocking and optical waveguiding. For instance, in accordance with the invention, the first emissive layer 420 includes non-emissive components which act to improve hole injection and transport. The layers shown in FIG. 2, in accordance with the invention, are described in greater detail below.

Substrate 408:

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. The substrate can also have transistors or other switching components built in to control the operation of the device.

First Electrode 411:

In one configuration, the first electrode 411 functions as an anode. The anode is a conductive layer which serves as a hole-injecting layer and which typically comprises a material with work function greater than about 4.5 eV. Typical anode materials include metals (such as platinum, gold, palladium, and the likes); metal oxides (such as lead oxide, tin oxide, ITO (indium tin-oxide), and the likes); graphite; doped inorganic semiconductors (such as silicon, germanium, gallium arsenide, and the likes); and doped conducting polymers (such as polyaniline, polypyrrole, polythiophene, and the likes).

For OLEDs, the first electrode layer 411 is usually thin enough so as to be semi-transparent and allow at least a fraction of light to transmit through (in bottom emitting OLEDs). The thickness of the first electrode 411 is from about 10 nm to about 1000 nm, preferably, from about 50 nm to about 200 nm, and more preferably, is about 100 nm. As such, any thin-film deposition method may be used in the first electrode fabrication step. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography can then be used to define any pattern in the lower electrode layer.

In accordance with the invention, the top exposed surface of first electrode 411 might become the deposition surface upon which the organic solution for the first emissive layer 420 or HTL 417 is deposited. In an alternative configuration, the first electrode layer 411 functions as a cathode (the cathode is a conductive layer which serves as an electron-injecting layer and which comprises a material with a low work function). The cathode, rather than the anode, is deposited on the substrate 408 in the case of, for example, a top-emitting OLED. Typical cathode materials are listed below in the section for the "second electrode 423". In cases where the first electrode is a cathode, the second emissive layer 421 would be deposited/fabricated thereon.

HTL 417:

The HTL (Hole Transporting Layer) 417 typically has a much higher conductivity than the subsequent organic layers and serves several purposes as outlined below: (1) a buffer to provide a good bond to the substrate; and/or (2) a hole injection layer to promote hole injection; and /or (3) a hole transport layer to promote hole transport. In accordance with the invention, HTL 417 may also act as an electron blocking layer.

The HTL 417 can be formed by deposition of an organic solution, polymers, monomers, side-groups, inorganic materials, dopants and/or small molecule materials. For example, the HTL 417 can be made of tertiary amine or carbazole derivatives both in their small molecule or their polymer form, or organic solutions such as conducting polyaniline ("PANI"), or preferably, solutions of "PEDOT:PSS." A PEDOT:PSS solution is comprised of water, polyethylenedioxythiophene ("PEDOT"), and polystyrenesulfonic acid ("PSS") (this solution is referred to, herein, as a PEDOT:PSS solution and may be combined with or contain other components as well. The HTL 417 has a thickness from about 5 nm to about 1000 nm, preferably from about 20 nm to about 500 nm, and more preferably from about 50 to about 250 nm.

The HTL 417 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. The hole transporting material is deposited on the first electrode 411 and then dried into a film. The dried material represents the HTL 417. Examples of typical base PEDOT:PSS solution are Baytron® P CH8000 and Baytron® AI4083, as supplied by HC Starck GmbH.

First Emissive Layer 420:

First emissive layer 420 can include one or more components processed into film. Preferably, at least some part of the first emissive layer 420 is a polymer or similar organic-based film, thought the layer 420 may also have inorganic components.

The first emissive layer 420 contains at least one organic component ("first emissive component") that is capable of emitting light when activated. Such components generally fall into two categories. The first category of OLEDs, referred to as polymeric light emitting diodes, or PLEDs, utilize components such as polymers in the first emissive layer 420. The polymers may be organic or organometallic in nature. As used herein, the term organic also includes organometallic materials. Devices utilizing polymeric components in first emissive layer 420 are especially preferred.

The first emissive component is one or more electroluminescent ("EL") polymers that emit light. The first emissive component can consist of, for example, conjugated EL polymers, such as polyfluorenes, polythiophenes, polyphenylenes, polythiophenevinylenes, or poly-p-phenylenevinylenes or their families, copolymers, derivatives, or mixtures thereof.

In accordance with the invention, the first emissive layer may also contain at least one non-emissive component. Non-emissive components may include, for instance, interlayer functionality such as hole transport. The first emissive component and non-emissive component can be blended physically, chemically reacted, cross-linked or otherwise bonded or doped with one another. The first emissive layer can be deposited via spin coating, inkjet printing or other deposition techniques. The first emissive component can be, for example, any class or type of EL conjugated polymers, such as polyfluorenes; poly-p-phenylenevinylenes that emit white, red, blue, yellow, or green light and are 2-, or 2,5- substituted poly-p-pheneylenevinylenes; polyspiro polymers; or their families, copolymers, derivatives, or mixtures thereof.

In addition to polymers, organic monomers or oligomers that emit by fluorescence or by phosphorescence can serve as first emissive component residing in first emissive layer 420, if blended with a polymer containing cross-linkable groups. Combinations of polymeric and smaller organic molecules can also serve as the first emissive component in first emissive layer 420. For example, a first emissive component may be chemically derivatized with a small organic molecule or simply mixed with a small organic molecule in forming first emissive layer 420.

In addition to active electronic materials that emit light, first emissive layer 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including C60, and compositions including derivatized C60 may be used.

One example of emissive polymers that can be used as first emissive component(s) are emissive polymers of the polyspiro family (such as spirobifluorene-co-fluorene polymers) which are soluble in common organic solvents such as toluene. These emissive polymers (which can be synthesized/purchased in red, green and blue emitting forms, for example) can be cross-linked with oxetane side-groups to render them insoluble (C. D. Muller et al, *Nature* 421, 829 (2003)). The emissive polymer solutions can also contain esters, di-aromatic bromides as well as a photo-acid to initiate cross-linking. The oxetane rings in this instance open up under application of UV radiation and cross-link with the emissive polymer. Often cross-linking by UV radiation can create side reactions with the emissive polymers such that radical cations are formed which adversely affect the electro-luminescent properties of the film. Post-baking and other steps may be needed after cross-linking if this is observed to be the case.

In accordance with the invention, the first emissive layer 420 is fabricated by 1) depositing a first emissive component and non-emissive component over the HTL 417; and 2) rendering the first emissive layer 420 insoluble by cross-linking or other mechanisms. Therefore, it also preferable that the first emissive layer 420 be made of components which are cross-linkable or partially cross-linkable. The first emissive layer 420 must be formed initially with components and other agents/additives/side-groups which enable the layer 420 to be cross-linked to such a degree that layer 420 is rendered insoluble to the solvent used in fabricating the second emissive layer 421 which is disposed above it. Cross-linking side-groups can be activated, for instance, by heat or by exposure to ultraviolet or other radiation.

In some embodiments of the invention, the first emissive layer 420 has only one emissive component, however, in alternate embodiments it may have several emissive components. Likewise, in some embodiments of the invention, the first emissive layer 420 has only one non-emissive component, however, in alternate embodiments it may have several non-emissive components. For instance, in some embodiments, the first emissive layer 420 may be composed of a non-emissive conjugated polymer and emissive conjugated polymer which can be cross-linked (together and/or with additional side-groups) to render it insoluble. In yet other embodiments, the first emissive layer 420 can be composed of a non-emissive conjugated polymer doped with an emissive monomer or an oligomer.

In accordance with the invention, the device 405 is capable of producing an output spectrum that is white or nearly white. In this regard, in some embodiments, first emissive layer 420 can emit light in a particular spectrum ("first spectrum"), preferably one distinct particular color such as red, green, blue, yellow, orange, or cyan, or any other color. In other embodiments, the first spectrum may include a combination of colors such as red and green, or red and blue, or blue and green, and so on. The first emissive component is chosen such that when activated it is capable of emitting light in the first spectrum. The particular color or colors of the first spectrum are not limited in any sense.

Second Emissive Layer 421

In accordance with the invention, a second emissive layer 421 can be fabricated over the first emissive layer 420 to provide a broader output spectrum such as that needed for white light. Layer 421 may also be cross-linked, if desired. In at least one embodiment of the invention, layer 421 has at least two emissive components, each capable of emitting light in a different spectrum than the other. The two emissive components in the second emissive layer 421 can be organic, semi-organic or inorganic, as desired. The second emissive layer 421 may be composed of components similar in structure and composition to that described above for first emissive layer 420. Thus, each of the components comprising second emissive layer 421 may be at least one or more of a polymer, polymer blend, monomer, oligomer, co-polymer, and an organic side-group. So, for instance, the second emissive layer may consist of a blend of two emissive polymers, an emissive polymer doped with an emissive small molecule or a co-polymer with a plurality of emissive chromophores incorporated on the polymer chain or as pendant groups.

In one embodiment, each emissive component (if there is more than one) in the second emissive layer 421 is capable of emitting light of a different distinct color. The combined emission from the second emissive layer is a "second spectrum" (which may consist of more than one different color spectra combined). In one embodiment of the invention, the first spectrum (emitted by first emissive layer 420) and the second spectrum combine to give a white output spectrum from device 405. Thus, if the first emissive layer emits a first spectrum of blue, the second emissive layer could be designed to emit both red and green. The concentrations of each emissive component in each layer can be modified based upon the exact output color desired. Thus, a white output spectrum from device 405 can be given a more pinkish hue by adjusting the concentration of red emissive components or by selecting a red emissive component that provides a deeper red color.

As mentioned above, the first emissive layer 420 can be cross-linked or otherwise rendered insoluble to the solution used to form second emissive layer 421. In this way, a wider range of components can be selected to fabricate second emissive layer 421 than would be possible using a non-cross-linked first emissive layer.

In still other embodiments, there may be three emissive layers, with each layer emitting light in a different spectrum. In such cases, the first two emitting layers could be cross-linked or otherwise rendered insoluble so as to allow simple deposition of wide range of solvents in fabricating the third emissive layer.

Second Electrode (423)

In one embodiment, second electrode 423 functions as a cathode when an electric potential is applied across the first electrode 411 and second electrode 423. In this embodiment, when an electric potential is applied across the first electrode 411, which serves as the anode, and second electrode 423, which serves as the cathode, photons are emitted from the first emissive layer 420 and the second emissive layer 421.

While many materials, which can function as a cathode, are known to those of skill in the art, most preferably a composition that includes aluminum, indium, silver, gold, magnesium, calcium, lithium, lithium fluoride, cesium fluoride, sodium fluoride, and barium, or combinations thereof, or alloys thereof, is utilized. Aluminum, and combinations of calcium and aluminum, barium and aluminum, lithium fluoride and aluminum, lithium fluoride with calcium and aluminum, magnesium and silver or their alloys are especially preferred.

Preferably, the thickness of second electrode 423 is from about 10 to about 1000 nanometers (nm), more preferably from about 50 to about 500 nm, and most preferably from about 100 to about 300 nm. While many methods are known to those of ordinary skill in the art by which the first electrode material may be deposited, vacuum deposition methods, such as thermal vacuum evaporation, sputtering or electron-beam deposition are preferred. Other layers (not shown) such as a barrier layer and getter layer may also be used to protect the electronic device. Such layers are well-known in the art and are not specifically discussed herein.

All of the organic or polymer layers and emissive layers mentioned above can be fabricated from a solution by ink-jet printing or spun coating or otherwise deposited. The solution used may be any "fluid" or deformable mass capable of flowing under pressure and may include solutions, inks, pastes, emulsions, dispersions and so on. The solution may also contain or be supplemented by further substances or solvents and the like which affect viscosity, contact angle, thickening, affinity, drying, dilution and so on of the deposited solution.

Often other steps such as washing and neutralization of films, the addition of masks and photo-resists may precede the cathode deposition. However, these are not specifically enumerated as they do not relate specifically to the novel aspects of the invention. Other steps (not shown) like adding metal lines to connect the anode lines to power sources may also be included in the workflow. Also, for instance, after the OLED is fabricated it is often encapsulated to protect the layers from environmental damage or exposure. Such other processing steps are well-known in the art and are not a subject of the invention.

Figure 3:
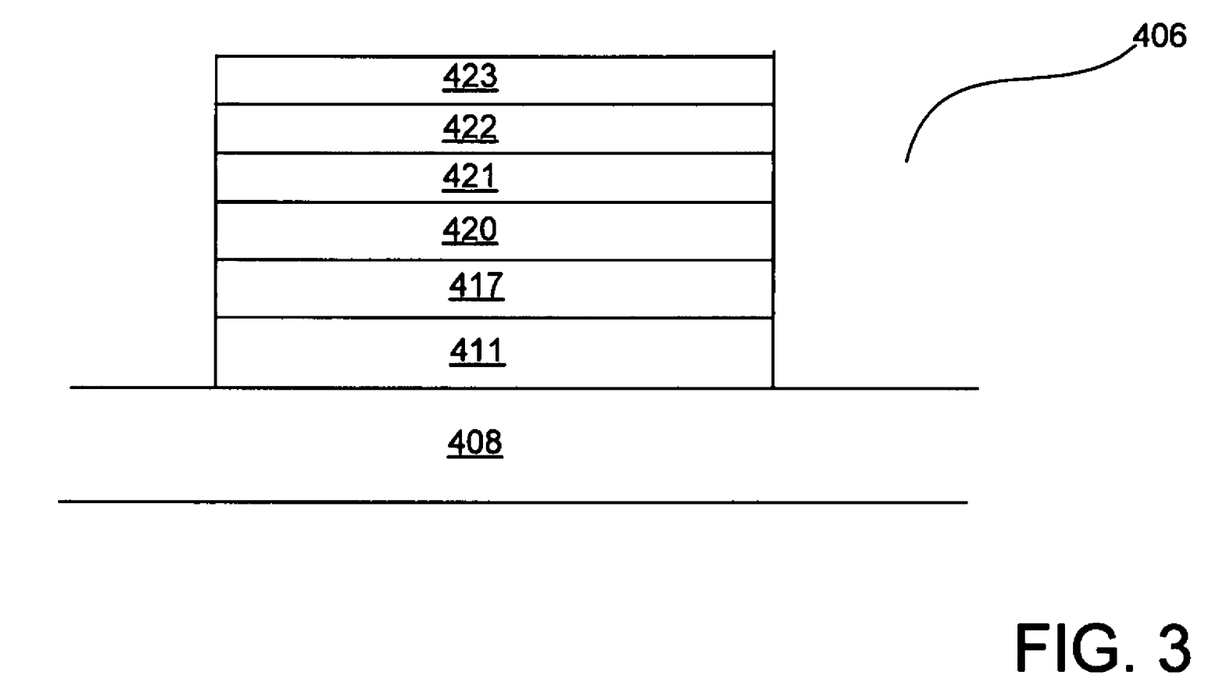
FIG. 3 shows a cross-sectional view of an organic electroluminescent device with three emissive layers according to at least one embodiment of the invention.

FIG. 3 shows a cross-sectional view of an organic electroluminescent device with three emissive layers according to at least one embodiment of the invention. The device 406 is identical in all or most aspects to device 405 of FIG. 2 except for the following. First emissive layer 420 and second emissive layer 421 still emit a first and second spectrum, respectively. However, in addition to first emissive layer 420 being rendered insoluble, second emissive layer 421 is also rendered insoluble by cross-linking or other means. The insolubility of second emissive layer 421 is with respect to the solvent used in fabricating a third emissive layer 422 as shown. Third emissive layer 422 consists at least one emissive component capable of emitting light in a third spectrum. In some embodiments of the invention, the first spectrum emitted by first emissive layer 420, the second spectrum emitted by second emissive layer 421 and the third spectrum emitted by third emissive layer 422 combine to give the device 406 a white output spectrum. Thus, if the first spectrum was blue, and the second spectrum green, then third spectrum could be chosen as red to produce a white output from device 405. The third emissive layer may be composed of at least one emissive component and any number of other components. These components can consist of one or more organic, semi-organic or inorganic substance including but not limited to, polymer, polymer blend, monomer, oligomer, co-polymer, and an organic side-group.

Figure 4:
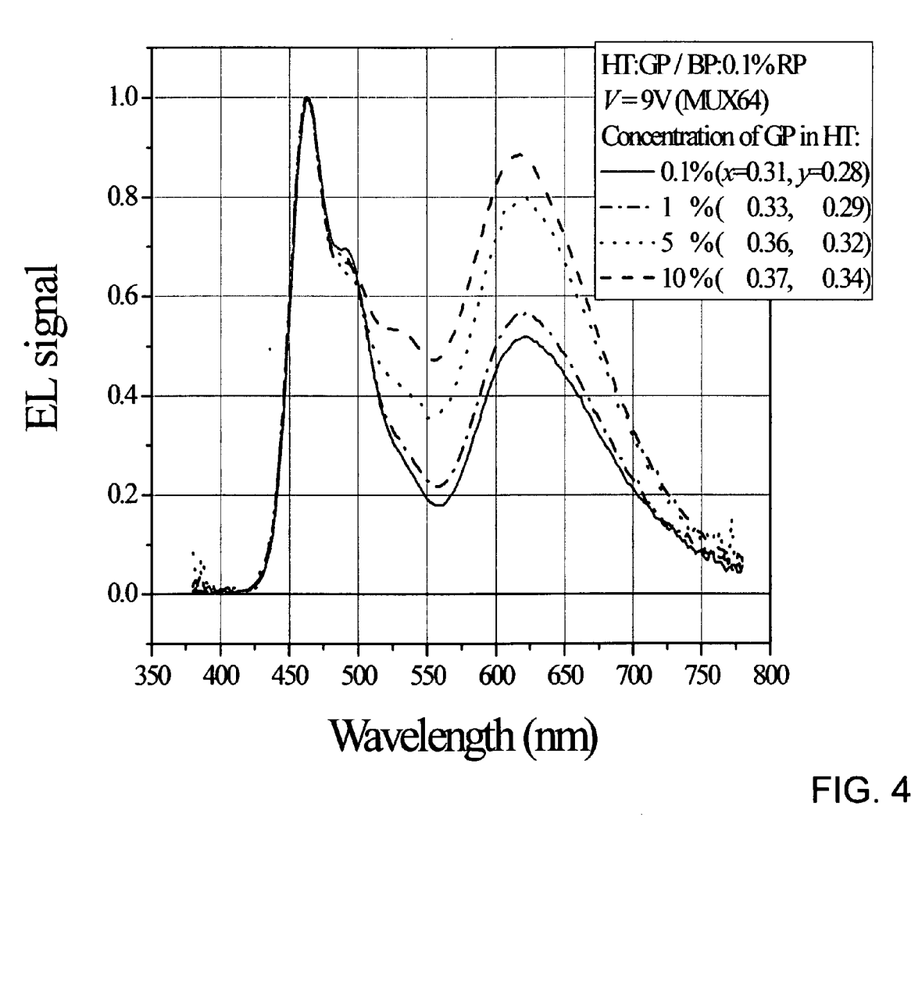
FIG. 4 illustrates the spectrum of devices produced in accordance with at least one embodiment of the invention.

FIG. 4 illustrates the spectrum of devices produced in accordance with at least one embodiment of the invention. In a experimental setting, an OLED device was produced and/or simulated having the following structure, in order from bottom to top,—glass substrate, an ITO (Indium Tin Oxide) anode, followed by a hole transporting layer of PEDOT:PSS of 60 nm thickness, a first emissive layer of 30 nm thickness consisting of blend of a hole-transporting polymer non-emissive component and green-emitting polymer emissive component, a second emissive layer of 75 nm thickness consisting of a blend of blue-emitting polymer emissive component and red-emitting polymer emissive component, a LiF layer followed by a calcium cathode with a aluminum overlayer. The hole-transporting polymer non-emissive component was selected to be cross-linkable.

Figure 5:
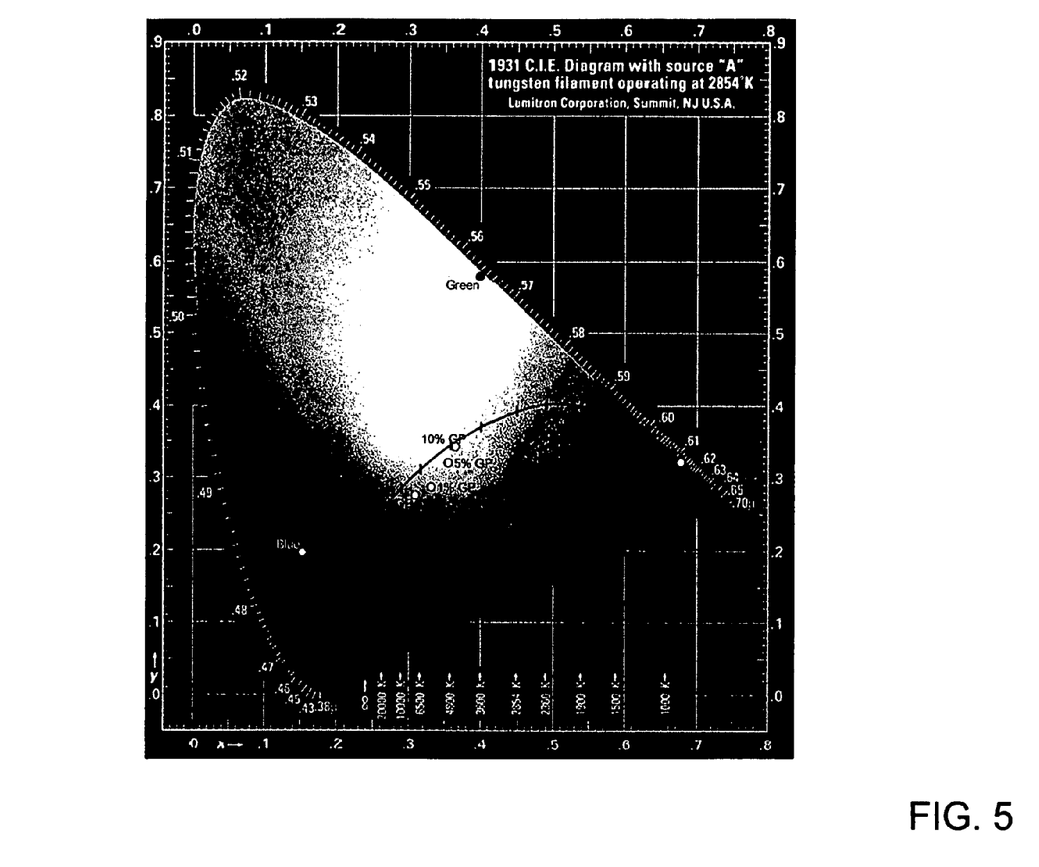
FIG. 5 illustrates the color of output based upon the CIE color space by devices produced in accordance with at least one embodiment of the invention.

In the experiments, the concentration in the second emissive layer of red-emitting polymer emissive component to blue-emitting polymer emissive component was fixed at 0.1% by weight. The concentration in the first emissive layer of green-emitting polymer emissive component to hole-transporting polymer non-emissive component was varied from between 0.1% by weight to 10% by weight. The resulting electroluminescence spectra are shown in FIG. 4. (see legend for details) and FIG. 5 illustrates the color of output based upon the CIE color space by devices produced in accordance with at least one embodiment of the invention. The results indicate that by adding sufficient amounts of green polymer into the cross-linkable hole-transporting polymer, blue-red emission can be turned into a more color-balanced white emission. This can be seen from the 1931-based CIE coordinates (x, y) shown in the legend in FIG. 4, as well as on the CIE diagram in FIG. 5. By adjusting relative concentrations of the blue and the red emitting polymer emissive components in the second emissive layer, i.e. reducing amount of red emission in this particular example, the (x,y) chromaticity coordinates can be adjusted to be equal to (0.33, 0.33) which corresponds to a true white color.

The OLED devices described above can be used within displays in applications such as, for example, computer displays, information displays in vehicles, television monitors, telephones, printers, and illuminated signs. The OLED devices discussed can also be used in general area lighting, industrial lighting and any variety of lighting applications.

What is claimed is:

1. An organic electroluminescent device, comprising:
a first emissive layer comprising a non-emissive component and a first emissive component, wherein at least one of said first emissive component and said non-emissive component includes at least one of a polymer, polymer blend, and co-polymer, and wherein the other one of said first emissive component and said non-emissive component includes at least one of a polymer, polymer blend, monomer, oligomer, co-polymer, and an organic side-group, and wherein the first emissive layer is cross-linked, said first emissive component capable of emitting light in a first spectrum;
a second emissive layer disposed over said first emissive layer, said second emissive layer comprising at least one additional emissive component, wherein said at least one additional emissive component includes at least one of a polymer, polymer blend, co-polymer, or at least one of a polymer, polymer blend, co-polymer in combination with at least one of a monomer, oligomer, and an organic side-group, said first emissive layer is insoluble to the material used in fabricating said second emissive layer, wherein said second emissive layer is capable of emitting light in a second spectrum, further wherein said first spectrum and second spectrum combine such that an output spectrum of said device is white.

2. A device according to claim 1 further comprising a substrate; and an anode disposed over said substrate.

3. A device according to claim 2 further comprising a hole transporting layer, said hole transporting layer disposed between said anode and said first emissive layer.

4. A device according to claim 3 further comprising a cathode disposed over said second emissive layer.

5. A device according to claim 1 wherein at least one of said first and second emissive layers comprises a conjugated polymer layer.

6. A device according to claim 1 wherein said first spectrum is green.

7. A device according to claim 6 wherein said second spectrum includes blue and at least one of red, orange and yellow.

8. A device according to claim 1 wherein said first spectrum is at least one of red, orange and yellow.

9. A device according to claim 8 wherein said second spectrum includes at least one of blue and green.

10. A device according to claim 1 wherein said first emissive component is a green-emitting polymer and said non-emissive component is a cross-linkable hole transporting polymer, said first emissive component blended together with said non-emissive component.

11. A device according to claim 10 wherein said at least one additional emissive component includes a blue-emitting polymer blended with a red-emitting polymer.

12. A device according to claim 11 wherein the concentration of red-emitting polymer to blue-emitting polymer is approximately 0.1 percent by weight.

13. A device according to claim 12 wherein the concentration of green-emitting polymer to hole-transporting polymer is chosen from the range of approximately 1 percent by weight to approximately 50% by weight.

14. A device according to claim 1 wherein said first spectrum is blue.

15. A device according to claim 14 wherein said second spectrum includes green and at least one of red, orange and yellow.

16. A device according to claim 1 wherein said second spectrum is blue.

17. A device according to claim 16 wherein said first spectrum includes green and at least one of red, orange and yellow.

18. An organic electroluminescent device, comprising:
a first emissive layer comprising a non-emissive component and a first emissive component, wherein at least one of said first emissive component and said non-emissive component includes at least one of a polymer, polymer blend, and co-polymer, and wherein the other one of said first emissive component and said non-emissive component includes at least one of a polymer, polymer blend, monomer, oligomer, co-polymer, and an organic side-group, and wherein the first emissive layer is cross-linked, said first emissive component capable of emitting light in a first spectrum;
a second emissive layer disposed over said first emissive layer, said second emissive layer comprising at least one secondary emissive component, wherein said at least one secondary emissive component includes at least one of a polymer, polymer blend, co-polymer, or at least one of a polymer, polymer blend, co-polymer in combination with at least one of a monomer, oligomer, and an organic side-group, and wherein the second emissive layer is cross-linked, said first emissive layer is insoluble to the material used in fabricating said second emissive layer, wherein said second emissive layer is capable of emitting light in a second spectrum; and
a third emissive layer disposed over said second emissive layer, said third emissive layer comprising at least one tertiary emissive component, wherein said at least one tertiary emissive component includes at least one of a polymer, polymer blend, co-polymer, or at least one of a polymer, polymer blend, co-polymer in combination with at least one of a monomer, oligomer, and an organic side-group, said second emissive layer is insoluble to the material used in fabricating said third emissive layer, wherein said third emissive layer is capable of emitting light in a third spectrum, further wherein said first spectrum, second spectrum and third spectrum combine such that an output spectrum of said device is white.

19. A device according to claim 18 further comprising a substrate; and an anode disposed over said substrate.

20. A device according to claim 19 further comprising a hole transporting layer, said hole transporting layer disposed between said anode and said first emissive layer.

21. A device according to claim 20 further comprising a cathode disposed over said third emissive layer.

22. A device according to claim 18 wherein at least one of said first and second emissive layers comprises a conjugated polymer layer.

23. A device according to claim 18 wherein said first spectrum is green.

24. A device according to claim 23 wherein said second spectrum includes blue and said third spectrum includes at least one of red, orange and yellow.

25. A device according to claim 23 wherein said third spectrum includes blue and said second spectrum includes at least one of red, orange and yellow.

26. A device according to claim 18 wherein said first spectrum is at least one of red, orange and yellow.

27. A device according to claim 26 wherein said second spectrum includes blue and said third spectrum includes green.

28. A device according to claim 26 wherein said third spectrum includes blue and said second spectrum includes green.

29. A device according to claim 18 wherein said first emissive component is a green-emitting polymer and said non-emissive component is a cross-linkable hole transporting polymer, said first emissive component blended together with said non-emissive component.

30. A device according to claim 29 wherein said secondary emissive component includes a blue-emitting polymer and said tertiary emissive component includes a red-emitting polymer.

31. A device according to claim 18 wherein said first spectrum is blue.

32. A device according to claim 31 wherein said second spectrum includes green and said third spectrum includes at least one of red, orange and yellow.

33. A device according to claim 31 wherein said third spectrum includes green and said second spectrum includes at least one of red, orange and yellow.

34. An organic electroluminescent device, comprising:
a first emissive layer comprising a non-emissive component and a first emissive component, wherein at least one of said first emissive component and said non-emissive component includes at least one of a polymer, polymer blend, and co-polymer, and wherein the other one of said first emissive component and said non-emissive component includes at least one of a polymer, polymer blend, monomer, oligomer, co-polymer, and an organic side-group, and wherein the first emissive layer is cross-linked, said first emissive component capable of emitting light in a first spectrum;

a second emissive layer disposed over said first emissive layer, said second emissive layer comprising at least one additional emissive component, wherein said at least one additional emissive component includes at least one of a polymer, polymer blend, co-polymer, or at least one of a polymer, polymer blend, co-polymer in combination with at least one of a monomer, oligomer, and an organic side-group, said first emissive layer is insoluble to the material used in fabricating said second emissive layer, wherein said second emissive layer is capable of emitting light in a second spectrum, further wherein said first spectrum and second spectrum combine to generate an output spectrum of said device.

35. An organic electroluminescent device, comprising:
a first emissive layer comprising a non-emissive component and a first emissive component, wherein at least one of said first emissive component and said non-emissive component includes at least one of a polymer, polymer blend, and co-polymer, and wherein the other one of said first emissive component and said non-emissive component includes at least one of a polymer, polymer blend, monomer, oligomer, co-polymer, and an organic side-group, and wherein the first emissive layer is cross-linked, said first emissive component capable of emitting light in a first spectrum;

a second emissive layer disposed over said first emissive layer, said second emissive layer comprising at least one secondary emissive component, wherein said at least one secondary emissive component includes at least one of a polymer, polymer blend, co-polymer, or at least one of a polymer, polymer blend, co-polymer in combination with at least one of a monomer, oligomer, and an organic side-group, wherein said second emissive layer is cross-linked, said first emissive layer is insoluble to the material used in fabricating said second emissive layer, wherein said second emissive layer is capable of emitting light in a second spectrum; and a third emissive layer disposed over said second emissive layer, said third emissive layer comprising at least one tertiary emissive component, wherein said at least one tertiary emissive component includes at least one of a polymer, polymer blend, co-polymer, or at least one of a polymer, polymer blend, co-polymer in combination with at least one of a monomer, oligomer, and an organic side-group, said second emissive layer is insoluble to the material used in fabricating said third emissive layer, wherein said third emissive layer is capable of emitting light in a third spectrum, further wherein said first spectrum, second spectrum and third spectrum combine to generate an output spectrum of said device.

* * * * *

UNITED STATES PATENT AND TRADEMARK OFFICE
CERTIFICATE OF CORRECTION

| | | |
|---|---|---|
| PATENT NO. | : 7,452,613 B2 | Page 1 of 1 |
| APPLICATION NO. | : 10/932830 | |
| DATED | : November 18, 2008 | |
| INVENTOR(S) | : Dmytro Poplavskyy et al. | |

It is certified that error appears in the above-identified patent and that said Letters Patent is hereby corrected as shown below:

On the Title Page item (56) References Cited, under U.S. Patent Documents, please add the following reference, which is missing:

2005/0100658 A1*   05/2005   MacPherson et al. .................. 427/58

Signed and Sealed this

Fourteenth Day of April, 2009

JOHN DOLL
*Acting Director of the United States Patent and Trademark Office*